United States Patent
Strasser

(10) Patent No.: US 11,654,850 B2
(45) Date of Patent: May 23, 2023

(54) DISTRIBUTED SENSOR SYSTEM FOR SENSING BODY PARTS AND PERSONS WITHIN THE HAZARD ZONES OF A CONVERTIBLE TOP

(71) Applicant: WEBASTO SE, Stockdorf (DE)

(72) Inventor: Andreas Strasser, Stockdorf (DE)

(73) Assignee: WEBASTO SE, Stockdorf (DE)

( * ) Notice: Subject to any disclaimer, the term of this patent is extended or adjusted under 35 U.S.C. 154(b) by 207 days.

(21) Appl. No.: 16/770,461

(22) PCT Filed: Dec. 5, 2018

(86) PCT No.: PCT/EP2018/083706
§ 371 (c)(1),
(2) Date: Jun. 5, 2020

(87) PCT Pub. No.: WO2019/110696
PCT Pub. Date: Jun. 13, 2019

(65) Prior Publication Data
US 2021/0162941 A1    Jun. 3, 2021

(30) Foreign Application Priority Data

Dec. 6, 2017  (DE) ..................... 10 2017 129 068.0

(51) Int. Cl.
B60R 21/0136  (2006.01)
B60R 11/00    (2006.01)
G01V 3/08     (2006.01)

(52) U.S. Cl.
CPC .......... *B60R 21/0136* (2013.01); *B60R 11/00* (2013.01); *G01V 3/088* (2013.01); *B60R 2011/004* (2013.01)

(58) Field of Classification Search
CPC ................. B60R 21/0136; B60R 11/00; B60R 2011/004; G01V 3/088; H03K 17/955;
(Continued)

(56) References Cited

U.S. PATENT DOCUMENTS

2001/0029416 A1* 10/2001 Breed .................. B60N 2/0248
                                                             340/5.2
2003/0071639 A1    4/2003 Haag
2007/0241585 A1   10/2007 Shimizu

FOREIGN PATENT DOCUMENTS

DE         10248761 A1    5/2004
DE         10305342 A1    9/2004
(Continued)

OTHER PUBLICATIONS

International Searching Authority. International Search Report and Written Opinion for application PCT/EP2018/083706, dated Mar. 15, 2019. With translation.

*Primary Examiner* — Lori L Lyjak
(74) *Attorney, Agent, or Firm* — Quarles & Brady LLP

(57) ABSTRACT

A safety system for detecting a body part in a dangerous area of a vehicle, a convertible roof having such a safety system and a corresponding method. The safety system includes at least one sensor node which respectively has a capacitive sensor and a processing unit, wherein the capacitive has at least one electrode and is designed to capture a capacitance change on account of a body part approaching the electrode, and wherein the processing unit is designed to generate capacitance change data on the basis of a capacitance change captured by the capacitive sensor; an evaluation unit which is designed to detect that there is a body part in a dangerous area at least on the basis of received capacitance change data; a data transmission device for transmitting the generated capacitance change data from a sensor node to the evaluation unit.

20 Claims, 3 Drawing Sheets

(58) Field of Classification Search
CPC ........... H03K 2217/94094; E05F 15/46; E05Y 2900/508; E05Y 15/40
See application file for complete search history.

(56) References Cited

FOREIGN PATENT DOCUMENTS

| | | |
|---|---|---|
| DE | 102004051638 A1 | 7/2005 |
| DE | 102005034035 A1 | 1/2007 |
| DE | 102005038678 A1 | 2/2007 |
| DE | 102006005327 A1 | 8/2007 |
| DE | 102006008281 A1 | 8/2007 |
| DE | 102007012463 A1 | 9/2008 |
| DE | 202007006510 U1 | 10/2008 |
| DE | 102008028932 A1 | 12/2009 |
| DE | 102009027201 A1 | 3/2011 |
| DE | 102012012865 A1 | 1/2014 |
| DE | 102013106704 A1 | 12/2014 |
| EP | 1187075 A2 | 3/2002 |
| EP | 2020340 A1 * | 2/2009 ......... B60R 21/0136 |
| WO | 2007048640 A1 | 10/2006 |
| WO | 2016097611 A1 | 6/2016 |

* cited by examiner

DISTRIBUTED SENSOR SYSTEM FOR SENSING BODY PARTS AND PERSONS WITHIN THE HAZARD ZONES OF A CONVERTIBLE TOP

This application represents the National Stage of International Application No. PCT/EP2018/083706, filed Dec. 5, 2018, which claims priority to German Patent Application DE 10 2017 129 068.0, filed Dec. 6, 2017, which disclosures are hereby incorporated by reference for all purposes.

DESCRIPTION

The disclosure relates to a safety system for detecting a body part in a dangerous area for a vehicle, to a roof having such a safety system, and to a corresponding method.

Proximity sensors which are based on a capacitive measurement and are able to contactlessly sense the approach of an object, for example a human body part, by virtue of a capacitance change are known from the prior art. Such sensors can be used to avert a dangerous situation, for example by virtue of a sensor causing an emergency shutdown of a drive motor or stopping of moving machine parts in good time. Contactless sensors are often installed in modern motor vehicles and ensure anti-trap protection, for example against a finger being trapped in the gap of a window which can be closed by means of an electrical window lifter or of an automatically closable tailgate or a boot lid.

WO 2007/048640 A1 discloses a circuit for sensing the approach of an object, for example human limbs, to a sensor electrode in an observation area. The circuit detects a change in the resonant behaviour of a capacitor system in the form of a phase shift. This circuit is aimed at an increased sensitivity of the underlying capacitive sensor. Such a circuit which is at least partially based on analogue circuitry has a large size and, as a result, is limited in terms of the possible ways of arranging it. A known proximity sensor system based on such a circuit and having a plurality of capacitive sensors for a motor vehicle has a central processing unit which determines a capacitance change from measured values captured in a decentralized manner by the sensors. For this purpose, lines are laid from sensors, at different measurement points inside a vehicle, to the processing unit which is in the boot of a vehicle, for example. The capacitance changes to be captured are small. The lines must therefore be carefully shielded since even very small interference can impair the measurement of the capacitance. For example, bends, the change in the position, the fastening or the environment of a line or a cable can already considerably influence the capacitance change to be determined. The shielding of the lines is complicated and expensive. Furthermore, special and expensive connectors are needed to connect the lines to a circuit board of the processing unit.

On the basis of this prior art, the object of the disclosure is to provide a safety system for detecting a body part in a dangerous area for a vehicle, which system can be implemented with lower outlay. In addition, the greatest possible flexibility is intended to be achieved for the arrangement of the sensors.

This object is achieved by means of a safety system according to claim 1, a roof according to claim 9, a method according to claim 12 and a use according to claim 13.

In particular, the object is achieved by means of a safety system for detecting a body part in a dangerous area for a vehicle, preferably for a convertible roof, comprising:

at least one sensor node which respectively has a capacitive sensor and a processing unit, wherein the capacitive sensor has at least one electrode and is designed to capture a capacitance change on account of a body part approaching the electrode, and wherein the processing unit is designed to generate capacitance change data on the basis of a capacitance change captured by the capacitive sensor;

an evaluation unit which is designed to detect that there is a body part in a dangerous area at least on the basis of received capacitance change data;

a data transmission device for transmitting the generated capacitance change data from a sensor node to the evaluation unit.

The disclosure is based on the concept of respectively assigning a capacitive sensor and a processing unit to a sensor node, wherein a sensor node, in particular a plurality of sensor nodes, is/are connected to an evaluation unit via a data transmission device. By virtue of a safety system according to the disclosure, a capacitance change can be captured in a decentralized manner by means of a sensor node and can be respectively (directly) processed to form capacitance change data. After transmission to an evaluation unit, the capacitance change data, preferably from a plurality of sensor nodes, can be centrally evaluated in order to detect a body part in a dangerous area and/or to evaluate information relating to body parts in dangerous areas. A dangerous area may be, for example, a clamping gap between moving parts of a vehicle, in which a human body part, for example a finger or a limb, could be trapped.

A separate processing unit is preferably assigned to each capacitive sensor. A sensor node may be understood as meaning a structural unit comprising a capacitive sensor and a processing unit which are arranged (together), in particular, on a printed circuit board or circuit board and/or in a housing. A sensor node is preferably in the form of an integrated circuit (IC) and may comprise a microcontroller. Such a sensor node has a small size and can be arranged flexibly at different locations.

In particular, a capacitive sensor captures a capacitance change of a capacitor as a physical measurement variable, in particular by means of a measurement electrode with respect to an earth electrode which form together form a capacitor. A capacitance change is caused, in particular, by a (human) body part or an object having electrically conductive or dielectric properties approaching a measurement electrode, which causes a (measurable) change in the electrical field. A capacitance change can be capacitively captured by means of a voltage change at the measurement electrode, the temporal change in the charging and/or discharging characteristic of a capacitor or a changed resonant behaviour of a resonant circuit which comprises the capacitor and an inductance. The physical measurement variable depends, in particular, on the measurement method and may be, in particular, a captured analogue voltage signal. A capacitive sensor may be understood as meaning a proximity sensor or a contact sensor.

A processing unit is preferably in the form of an electronic circuit connected to the capacitive sensor. A capacitive change captured by the capacitive sensor may be determined by the processing unit in the form of a capacitive change value, for example a capacitance difference, a capacitance ratio, a frequency difference, a frequency ratio or a phase angle. In particular, a processing unit determines a change in a capacitance with respect to a reference as capacitance change values on the basis of the physical measurement variable captured by the capacitive sensor and generates capacitance change data therefrom. For example, a capacitance change may be described by a frequency shift or change or a phase shift or phase angle of captured voltage signals. Capacitance change data may be understood as meaning those data from which information relating to a capacitance change is obtained, in particular data which are suitable for (unambiguously) describing a capacitance change. A capacitance change may comprise a change in a capacitance with respect to a reference for a capacitance, preferably a capacitance reference value. Capacitance reference values or a progression of capacitance reference values can be predefined, for example on the basis of a number of stored values which are capacitance reference values or from which capacitance reference values can be generated. In this respect, a capacitance change can be understood as meaning a deviation from a reference capacitance or a reference capacitance profile. Capacitance reference values can change over time or can remain (temporarily) unchanged. Capacitance change data can also contain the information indicating that no capacitance change or deviation of a capacitance from a reference has (currently) been captured. In particular, capacitance change data could also contain information which has already been (partially) evaluated and indicates whether or not there is a body part in a dangerous area assigned to a sensor node. Capacitance change data may be transmitted, in particular sent, in the form of digital signals or signal sequences, in particular binary data, from a sensor node to the evaluation unit via the data transmission device. A sensor node comprises, in particular, a transmitting/receiving unit (transceiver). A data transmission device may be wired or wireless, in particular may be in the form of a radio connection.

Transmitting processed data in the form of capacitance change data, instead of physical measurement variables describing a capacitance change, for example in the form of analogue voltage signals, makes it possible to dispense with shielding of the transmission lines. Preferably, the lines of the data transmission device are not shielded, are not separately shielded or are only slightly shielded. The transmitted capacitance change data are less susceptible to interference from electromagnetic influences on a transmission line than a captured measurement signal itself. As a result, the safety system according to the disclosure can be implemented with little outlay. In particular, already existing data transmission devices, in particular data transmission devices inside the vehicle, can be used to connect sensor nodes.

In one advantageous development of the disclosure, the data transmission device comprises a communication connection with real-time capability which is, in particular, in the form of a bus system, preferably in the form of a CAN bus or a FlexRay bus. A sensor node comprises, in particular, a bus connection, in particular a bus controller. A sensor node is connected to a bus system, in particular via at least one connecting line, preferably a spur line. A plurality of sensor nodes can be communicatively connected to one another via the data transmission device. For safety-relevant applications, it is advantageous if it is possible to transmit data in real time. The at least one sensor node can be connected to a vehicle bus present in a vehicle, preferably a CAN bus (CAN: Controller Area Network) or a FlexRay bus. As a result, existing data transmission lines can be used for the safety system with little design complexity.

In one advantageous development of the disclosure, a plurality of, preferably all, sensor nodes of the safety system are connected to a single evaluation unit via the data transmission device. As a result, capacitance changes can be captured in a decentralized manner and determined at a plurality of measurement locations in order to be centrally used to detect a body part in a dangerous area at an evaluation location. As a result, the capacitance change data from a plurality of sensor nodes can be taken into account for the detection in order to achieve a more reliable detection result, on the one hand, and to have to provide only a single evaluation unit, on the other hand.

In one advantageous development of the disclosure, the capacitance change data comprise a frequency ratio, in particular a ratio of a detuned resonant frequency of a resonant circuit and a reference frequency of an oscillation-generating circuit which preferably comprises an oscillating crystal. An oscillation-generating circuit is designed to generate a reference oscillation and comprises, for example, an oscillating crystal or an RC oscillator. A frequency ratio can be understood as meaning a quotient of two frequency values. The frequency values relate, in particular, to a reference frequency, for example the natural frequency of a resonant circuit or the natural frequency of an oscillation-generating element (for example oscillating crystal), and a detuned resonant frequency of a resonant circuit, wherein the detuning is caused by a capacitance change on account of a body part approaching the capacitive sensor. Such a resonant circuit comprises, in particular, a capacitor of the capacitive sensor. Alternatively, the capacitive change data may also contain at least two frequency values, a frequency difference value, at least two capacitance values, a capacitance ratio, a capacitance difference value and/or a phase angle, in particular depending on the measurement method of the capacitive sensor and the circuit of the processing unit.

In one advantageous development of the disclosure, the evaluation unit is designed to compare capacitance change values contained in the received capacitance change data with stored capacitance change threshold values. In particular, capacitance change data are read in order to obtain capacitance change values contained therein. Predefined stored threshold values can be read from a storage unit by the evaluation unit. The evaluation unit can be optionally designed to determine, preferably calculate, capacitance change threshold values. In addition to capacitance change values, capacitance change threshold values may take into account further parameters, for example temperature values or humidity values. Speed values or rotational angle values of a drive motor of an adjustable device, such as a roof, a window, a flap or a sliding roof, can also be taken into account. By comparing capacitance change values with capacitance change threshold values, the evaluation unit can detect whether there is a body part in a dangerous area, in particular if a capacitance change value reaches or exceeds a capacitance change threshold value.

In one advantageous development of the disclosure, the evaluation unit is designed to receive temperature measurement data and/or humidity measurement data and, in particular, to determine, preferably calculate, capacitance change threshold values taking into account received temperature measurement data and/or humidity measurement data. In particular, temperature sensors and/or humidity sensors can be connected to the data transmission device in order to transmit measurement data containing temperature values and/or humidity values to the evaluation unit. Speed sensors or rotational angle sensors can also be connected to the data transmission device in order to take into account, for example, a current position or a speed of a moving (opening or closing) device of a vehicle, such as a roof, a sliding roof, a flap or a window, when detecting a body part in a dangerous area. A capacitance change, in particular the magnitude of a capacitance change value, can depend on the temperature and/or the humidity. Taking these parameters into account makes it possible to improve the accuracy of the safety system, that is to say body parts in a dangerous area can be detected in a more reliable manner.

In one advantageous development of the disclosure a first sensor node is designed to sense a body part in the dangerous area of a linkage of a roof of a vehicle, in particular a convertible roof; and/or a second sensor node is designed to sense a body part in the dangerous area of a header panel of a vehicle; and/or a third sensor node is designed to sense a body part in the dangerous area of a roof compartment lid of a vehicle.

In this manner, a particular dangerous area of a vehicle can be respectively monitored by means of a sensor node. Respective dangerous areas of a convertible roof, to which the sensor nodes are assigned, can preferably be monitored, wherein, if a body part is detected in one or more of the dangerous areas, the evaluation unit can cause the opening or closing of the convertible roof to be stopped in good time in order to avert the danger of a body part being trapped.

In one advantageous development of the disclosure a first sensor node, in particular an electrode of the capacitive sensor of the first sensor node, can be fitted to a linkage, preferably a metal linkage, of a roof of a vehicle and/or can be connected thereto in an electrically conductive manner; and/or a second sensor node, in particular an electrode of the capacitive sensor of the second sensor node, can be fitted to a cowl of a vehicle and/or can be connected thereto in an electrically conductive manner; and/or a third sensor node, in particular an electrode of the capacitive sensor of the third sensor node, can be fitted to a roof compartment lid of a vehicle and/or can be connected thereto in an electrically conductive manner.

In particular, an electrode, in particular a measurement electrode, of a capacitive sensor may be in the form of a surface electrode, for example in the form of a wire mesh or a plate, preferably a thin plate, or a strip. In particular, when the roof is mounted on a vehicle, an electrode is connected to a linkage of the roof, a header panel or a roof compartment lid of the vehicle in an electrically conductive manner. The first, second and/or third sensor node is preferably connected, via connecting lines, to a data transmission device, preferably a vehicle bus present in the vehicle or a bus system separately provided for the safety system.

In one advantageous development of the disclosure, at least one sensor node comprises an evaluation unit which is designed to detect that there is a body part in a dangerous area assigned to the sensor node at least on the basis of capacitance change data generated by the processing unit. Such an evaluation unit can be understood as meaning a (local) evaluation unit, in particular a separate evaluation unit, which is assigned to the sensor node and may be part of a structural unit of the sensor node. In particular, the capacitance change data transmitted to a superordinate (central) evaluation unit via the data transmission device contain an item of information indicating whether there is a body part in a dangerous area assigned to this sensor node, for example in the form of a (binary) status value (yes/no). In this respect, a sensor node can also have (sub)functions which were described above in connection with the (superordinate) evaluation unit. In this case, the superordinate evaluation unit can be designed to centrally evaluate the capacitance change data containing information relating to body parts in dangerous areas of the individual sensor nodes, for example to prioritize them, to check them for consistency or to make a decision for the entire safety system comprising a plurality of (or all) sensor nodes, in particular for a roof or a similarly complex device.

Said object is also achieved, in particular, by means of a roof for a vehicle, in particular a convertible roof, comprising a safety system according to the disclosure. A roof according to the disclosure has the same advantages as those already described in connection with the safety system according to the disclosure.

In one advantageous development of the disclosure, the roof, in particular a linkage, preferably a metal linkage, of the roof, is electrically insulated, in particular with respect to a vehicle body. In particular, a sensor node is fitted to the linkage, wherein the electrode of the capacitive sensor is preferably connected to the linkage in an electrically conductive manner or the linkage itself forms an electrode. A further electrode of the capacitive sensor can be connected to earth. As a result of electrical insulation of the linkage, a capacitive change can be captured in a dangerous area in the vicinity of the linkage in a simple manner by means of the electrode formed or connected thereto, in particular without being distorted by interfering electromagnetic influences of the vehicle body.

In one advantageous development of the disclosure, the roof has a roof compartment lid which is electrically insulated, in particular with respect to a vehicle body. In particular, a sensor node is fitted to the roof compartment lid, preferably in order to monitor a gap between the vehicle body and a roof compartment lid which can be opened and closed. The electrode of the capacitive sensor, preferably in the form of a surface electrode, is fastened, in particular, on or to a roof compartment lid, preferably along an edge of the gap. The roof compartment lid may be completely or partially constructed from a metal material. A further electrode of the capacitive sensor can be connected to earth. This results in advantages in a similar manner to those described in connection with an electrically insulated linkage of the roof.

Said object is also achieved, in particular, by means of a method for detecting a body part in a dangerous area for a vehicle, preferably for a convertible roof, which has, in particular, a safety system according to the disclosure, comprising the following steps of:

capturing a capacitance change by means of a capacitive sensor of a sensor node on account of a body part approaching an electrode of the capacitive sensor;

generating capacitance change data by means of a processing unit of the sensor node on the basis of the capacitance change captured by the capacitive sensor;

transmitting the generated capacitance change data from the sensor node to an evaluation unit via a data transmission device, preferably via a bus system;

detecting that there is a body part in a dangerous area by means of the evaluation unit at least on the basis of the received capacitance change data.

The method according to the disclosure has similar advantages to those already described in connection with the safety system according to the disclosure and the roof according to the disclosure and can implement some or all method features described in connection with the safety system or the roof.

In particular, generated capacitance change data are transmitted, preferably in real time, via a CAN bus or a FlexRay bus. The method preferably comprises transmitting the capacitance change data from a sensor node to the evaluation unit and preferably also receiving the capacitance change data from a sensor node, in particular all sensor nodes, by means of the evaluation unit. A processing unit preferably codes capacitance change values to form capacitance change data, whereas the evaluation unit preferably reads capacitance change values from the capacitance change data. The evaluation unit preferably receives capacitance change data containing a frequency ratio from a sensor node. However, a (central) evaluation unit can also receive capacitance change data from the sensor nodes, preferably from (local) evaluation units assigned to the latter, which data contain information relating to whether there is a body part in a dangerous area assigned to this sensor node. The method can also determine or calculate capacitance change threshold values, preferably on the basis of temperature measurement data and/or humidity measurement data. The method according to the disclosure can be used, in particular, to monitor dangerous areas for a vehicle, preferably dangerous areas of a convertible roof, in order to detect body parts in dangerous areas. A method according to the disclosure can be implemented with little outlay and makes it possible to arrange the sensor nodes in a flexible manner.

Said object is also achieved, in particular, by means of the use of a capacitive sensor and a processing unit, which are designed to capture a capacitance change and to generate capacitance change data, as sensor nodes for connection to a data transmission device, preferably a bus system, of a vehicle for the purpose of detecting a body part in a dangerous area, preferably of a convertible roof.

Exemplary embodiments of the disclosure are explained in more detail below on the basis of the drawings, in which.

In the following description of the disclosure, the same reference signs are used for identical and identically acting elements.

Figure 1:
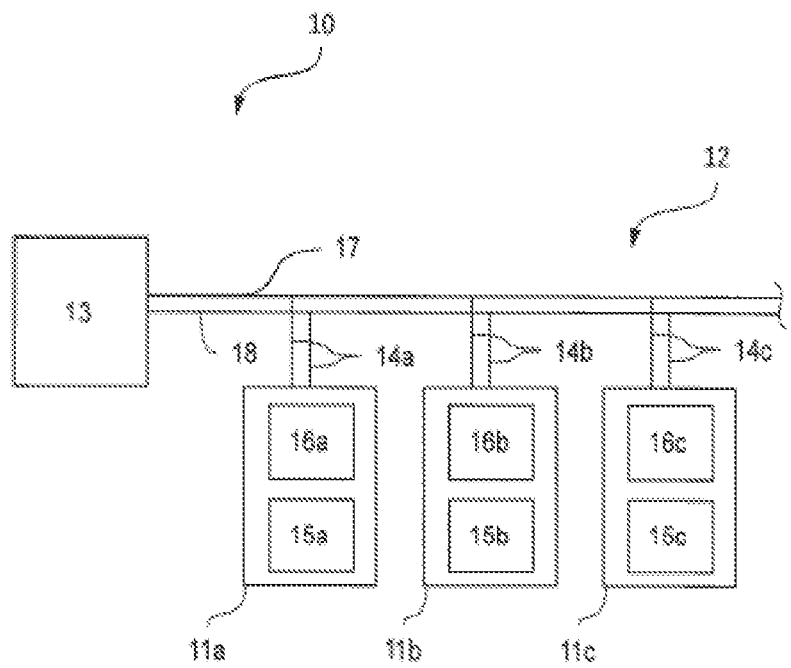
FIG. 1 shows a schematic illustration of an embodiment of a safety system according to the disclosure as a block diagram.

FIG. 1 shows, by way of example, an embodiment of a safety system 10 according to the disclosure having three sensor nodes 11a, 11b, 11c and an evaluation unit 13 which are connected to one another in a signal-conducting manner via a data transmission device 12. Each sensor node 11a, 11b, 11c respectively comprises a capacitive sensor 15a, 15b, 15c and an associated processing unit 16a, 16b, 16c which together form a structural unit, for example by virtue of them being arranged together in a housing, on a circuit board or on carrier bodies connected to one another. The sensor nodes 11a, 11b, 11c are each connected in a signal-conducting manner to the data transmission device 12 via connecting lines 14a, 14b, 14c, wherein the connecting lines 14a, 14b, 14c may be in the form of electrical conductor tracks or wires, for example. In this case, the data transmission device 12 is in the form of a CAN bus having a CAN high line 17 and a CAN low line 18 which are connected to the respective sensor node 11a, 11b, 11c via a connecting line 14a, 14b, 14c in each case. Shielding of connecting lines or conductor tracks may be provided between a capacitive sensor 15a, 15b, 15c and a processing unit 16a, 16b, 16c. However, the connecting lines 14a, 14b, 14c and the data bus lines, here the lines of the CAN bus system 17 and 18 (CAN high and CAN low), of the data transmission device 12 are preferably not shielded, at least not separately shielded. In this case, the safety system 10 is illustrated in section on the right-hand side and may comprise further sensor nodes. In particular, further sensor nodes which do not functionally belong to the safety system 10 may be connected to the data transmission device 12.

The capacitive sensors 15a, 15b, 15c are in the form of proximity sensors having an electrode (not illustrated) which captured an approach of a body part to the electrode as a capacitive change, preferably as the detuning of a resonant frequency of a resonant circuit in comparison with a reference frequency. The processing units 16a, 16b, 16c have the function of determining a capacitance change value from a capacitance change captured using metrology and to generate capacitance change data therefrom. These capacitance change data are transmitted to the evaluation unit 13 via the connecting lines 14a, 14b, 14c and also via the data transmission device 12. The capacitance change data preferably contain a frequency ratio which (unambiguously) describes the captured capacitance change. The evaluation unit 13 has the function of detecting whether there is a body part in a dangerous area monitored by one of the capacitive sensors 15a, 15b or 15c on the basis of the capacitance change values contained in the capacitance change data. For the detection, the evaluation unit 13 compares the received capacitance change data or values with stored capacitance change threshold values. The capacitance change threshold values correspond to a stipulated threshold value which defines a criterion of whether a capacitance change is large enough to be able to infer that there is a body part in a dangerous area. The safety system 10 according to the disclosure has the advantage that it can be implemented with little outlay and the sensor nodes 11a, 11b and 11c can be spatially arranged in a flexible manner. Capacitance change data, in particular in the form of digital signals, are transmitted instead of physical measurement variables, in particular in the form of analogue voltage signals. Capacitance change data are less susceptible to interference, in particular to electromagnetic influences on transmission lines. As a result, it is possible to dispense with shielding of the lines of the data transmission device 12. The sensor nodes 11a, 11b, 11c can be placed, in which case only the length of the connecting lines 14a, 14b, 14c must be selected appropriately.

Figure 2A:
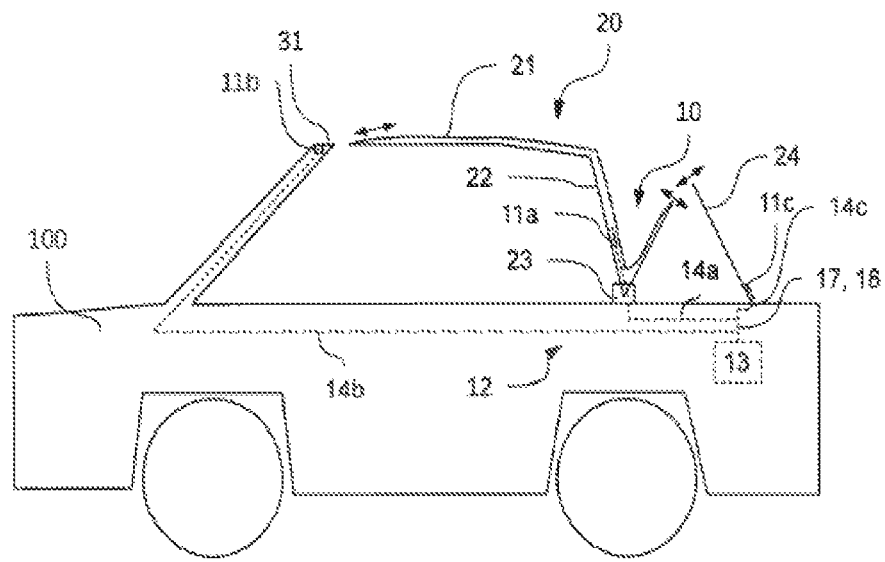
FIG. 2a shows a schematic illustration of an embodiment of a roof according to the disclosure having a safety system, wherein the roof is mounted on a vehicle, in a side view.
Figure 2B:
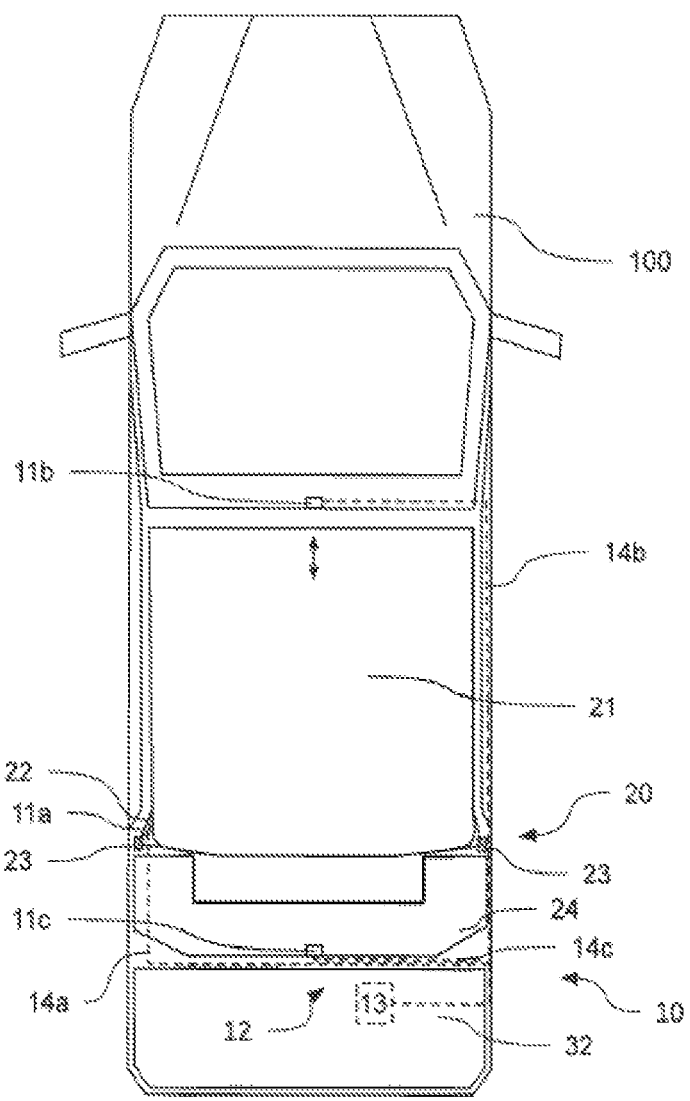
FIG. 2b shows a schematic illustration of the embodiment according to FIG. 2a in a plan view.

FIGS. 2a and 2b show an embodiment of a roof 20 according to the disclosure having a safety system 10 according to the disclosure, as described in connection with FIG. 1. The roof 20 is mounted on a vehicle 100, here a convertible, and is accordingly in the form of a convertible roof. The vehicle 100 has a boot with a boot lid 32, wherein the evaluation unit 13 is arranged here in the boot, but could likewise be arranged at another location inside the vehicle 100. The roof 20 here is in the form of a flexible roof (soft top) with a roof material 21 which is carried by a metal linkage 22, but could also be in the form of a foldable roof made of a stable material (hard top). The roof 20 is mounted in the body of the vehicle 100 via roof bearings 23 on both sides and can be stowed in a roof compartment (not illustrated) having a roof compartment lid 24. The movement of the roof 20 is indicated by double-headed arrows. A first sensor node 11a is fitted to the linkage 22 which is electrically insulated. The linkage 22 forms an electrode of the capacitive sensor 15a or is connected to said electrode in an electrically conductive manner. The capacitive sensor 15a of the first sensor node 1 1a monitors a dangerous area in the vicinity of the linkage 22 and preferably in the vicinity of those parts of the roof 20 which are connected to the linkage 22 in a conductive manner, for example roof bows or further struts. A second sensor node 11b is fitted to the header panel 31 of the vehicle 100 in order to monitor a dangerous area along the front edge of the roof 22 or in the vicinity of the locking mechanism, in particular at closure hooks on both sides. A third sensor node 11c is fitted to the roof compartment lid 24 in order to monitor a dangerous area in the vicinity of a gap between an edge of the roof compartment lid 24 and the vehicle body. In this case, the data transmission device 12 is in the form of a CAN bus system, wherein the sensor nodes 11a, 11b, 11c can be connected to a vehicle bus present inside the vehicle, or a separate data bus can be provided for the safety system 10, in particular especially for the roof 20. Further sensor nodes for monitoring dangerous areas of the roof 20 can be provided at other locations, preferably on both sides of the vehicle 100. Capacitance change data describing a change in a capacitance or a deviation of a capacitance from a capacitance reference are transmitted via the data transmission device 12. For example, a progression of reference values could be stored, preferably in a position-dependent manner, for a movement of the roof 20, which is used as a reference for determining a capacitance change or deviation with respect to this reference. If a capacitance change value exceeds a predefined capacitance change threshold value, for example, the movement is stopped. A roof 20 according to the disclosure has the advantage that the sensor nodes 11a, 11b, 11c can be arranged in a flexible manner and the safety system 10 can be implemented with little outlay in terms of lines. A roof 20 according to the disclosure could also be provided for vehicles other than a motor vehicle, for example for a boat.

It is pointed out at this juncture that all of the above-described aspects of the disclosure are claimed as being essential to the disclosure alone and in any combination, in particular the details illustrated in the drawings. A corresponding situation applies to the method steps explained. Modifications thereof are familiar to a person skilled in the art.

LIST OF REFERENCE SIGNS

Safety system
11a First sensor node
11b Second sensor node
11c Third sensor node
12 Data transmission device
13 Evaluation unit
14a, b, c Connecting line
15a, b, c Capacitive sensor
16a, b, c Processing unit
17 CAN high line
18 CAN low line
20 Roof
21 Roof material
22 Linkage
23 Roof bearing
24 Roof compartment lid
31 Header Panel
32 Boot lid
100 Vehicle

The invention claimed is:

1. Safety system for detecting a body part in an area of a vehicle comprising:
 a plurality of sensor nodes which respectively have a capacitive sensor and a processing unit,
 wherein the capacitive sensor has at least one electrode and is designed to capture a capacitance change on account of a body part approaching the electrode, and
 wherein the processing unit is designed to generate capacitance change data on the basis of a capacitance change captured by the capacitive sensor;
 wherein capacitive change data are binary data that contain information indicating whether or not there is a body part in an area assigned to a sensor node;
 an evaluation unit which is designed to detect that there is a body part in an area of the vehicle at least on the basis of received capacitance change data received from the plurality of sensor nodes;
 a data transmission device for transmitting the generated capacitance change data from a sensor node to the evaluation unit.

2. The safety system according to claim 1, wherein the data transmission device comprises a communication connection with real-time capability.

3. The safety system according to claim 1, wherein of the sensor nodes in the plurality of sensor nodes of the safety system are connected to a single evaluation unit via the data transmission device.

4. The safety system according to claim 1, wherein the capacitance change data comprise a frequency ratio and a reference frequency of an oscillation-generating circuit.

5. The safety system according to claim 1, wherein the evaluation unit is designed to receive temperature measurement data and/or humidity measurement data and to determine capacitance change threshold values taking into account received temperature measurement data and/or humidity measurement data.

6. The safety system according to claim 1, wherein
 a first sensor node is designed to sense a body part in the area of a linkage of a convertible roof of a vehicle; and/or
 a second sensor node is designed to sense a body part in the area of a cowl of a vehicle; and/or
 a third sensor node is designed to sense a body part in the area of a roof compartment lid of a vehicle.

7. The safety system according to claim 1, wherein
 a first sensor node is fitted to a linkage of a roof of a vehicle and/or is connected thereto in an electrically conductive manner; and/or
 a second sensor node is fitted to a cowl of a vehicle and/or is connected thereto in an electrically conductive manner; and/or
 a third sensor node is fitted to a roof compartment lid of a vehicle and/or is connected thereto in an electrically conductive manner.

8. The safety system according to claim 1, wherein at least one sensor node comprises an evaluation unit which is designed to detect that there is a body part in an area assigned to the sensor node at least on the basis of capacitance change data generated by the processing unit.

9. The safety system according to claim 1 wherein the part of a vehicle is a convertible roof.

10. The safety system according to claim 9, wherein the convertible roof includes a linkage that is electrically insulated with respect to a vehicle body.

11. The safety system according to claim 9, wherein the convertible roof includes a roof compartment lid which is electrically insulated with respect to a vehicle body.

12. Method for detecting a body part in an area of a vehicle comprising a safety system according to claim 1, comprising the following steps of:
 capturing a capacitance change by means of a capacitive sensor of a sensor node on account of a body part approaching an electrode of the capacitive sensor;

generating capacitance change data by means of a processing unit of the sensor node on the basis of the capacitance change captured by the capacitive sensor, wherein capacitive change data are binary data containing information indicating whether there is a body part in an area assigned to at least one of the plurality of sensor nodes;

transmitting the generated capacitance change data from the plurality of sensor nodes to an evaluation unit via a data transmission device;

detecting that there is a body part in an area by means of the evaluation unit at least on the basis of the capacitance change data received from the plurality of sensor nodes.

13. Use of a capacitive sensor and a processing unit, which are designed to capture a capacitance change and to generate capacitance change data, wherein capacitance change data are binary data that contain information indicating whether or not there is a body part in a dangerous area assigned to a sensor node, as sensor nodes for connection to a data transmission device of a vehicle for the purpose of detecting a body part.

14. The safety system_according to claim 1, wherein the data transmission device comprises a bus system.

15. The safety system_according to claim 1, wherein bus system is a CAN bus or a FlexRay bus.

16. The safety system according to claim 1, wherein all sensor nodes of the safety system are connected to a single evaluation unit via the data transmission device.

17. The safety system according to claim 4, wherein the frequency ratio comprises a ratio of a detuned resonant frequency of a resonant circuit.

18. The safety system according to claim 4, wherein the reference frequency of the oscillation-generating circuit comprises an oscillating crystal.

19. The safety system according to claim 7, wherein the linkage is a metal linkage.

20. The safety system according to claim 7, wherein the first, second, and third sensor nodes each comprise an electrode of the corresponding capacitive sensor.

* * * * *

UNITED STATES PATENT AND TRADEMARK OFFICE
CERTIFICATE OF CORRECTION

PATENT NO. : 11,654,850 B2
APPLICATION NO. : 16/770461
DATED : May 23, 2023
INVENTOR(S) : Andreas Strasser It is certified that error appears in the above-identified patent and that said Letters Patent is hereby corrected as shown below:

In the Specification

Column 8, Line 62, "1 la" should be --11a--.

In the Claims

Column 10, Claim 3, Line 18, "wherein of" should be --wherein all of--.

Signed and Sealed this
Eleventh Day of July, 2023

Katherine Kelly Vidal
*Director of the United States Patent and Trademark Office*